(12) United States Patent
Alcalde et al.

(10) Patent No.: US 10,177,758 B2
(45) Date of Patent: Jan. 8, 2019

(54) DRIVER FOR A P-CHANNEL MOSFET

(71) Applicant: DET International Holding Limited, Grand Cayman (KY)

(72) Inventors: André Luis Pesco Alcalde, Freiburg (DE); Christian Krumpholz, Freiburg (DE)

(73) Assignee: DET INTERNATIONAL HOLDING LIMITIED, George Town (KY)

( * ) Notice: Subject to any disclaimer, the term of this patent is extended or adjusted under 35 U.S.C. 154(b) by 78 days.

(21) Appl. No.: 15/266,534

(22) Filed: Sep. 15, 2016

(65) Prior Publication Data
US 2017/0093393 A1 Mar. 30, 2017

(30) Foreign Application Priority Data

Sep. 25, 2015 (EP) .................................. 15186921

(51) Int. Cl.
| | | |
|---|---|---|
| H03B 1/00 | (2006.01) |
| H03K 3/00 | (2006.01) |
| H03K 17/567 | (2006.01) |
| H03K 17/687 | (2006.01) |

(52) U.S. Cl.
CPC ....... H03K 17/567 (2013.01); H03K 17/6877 (2013.01)

(58) Field of Classification Search
USPC ................................................. 327/108–112
See application file for complete search history.

(56) References Cited

U.S. PATENT DOCUMENTS 4,410,809 A 10/1983 Furuichi et al.
4,426,143 A * 1/1984 Mizokami .............. G03B 15/05
396/163

(Continued)

FOREIGN PATENT DOCUMENTS

CN 101959351 1/2011

OTHER PUBLICATIONS

European Search Report for EP application No. 15186921.1, dated Mar. 16, 2016.

*Primary Examiner* — Adam Houston
(74) *Attorney, Agent, or Firm* — Vector IP Law Group LLC

(57) ABSTRACT

The invention concerns a driver circuit for driving a P-Channel MOSFET. The driver circuit is fed by a DC voltage supplied at a power input and it receives a control signal at a control input. The control signal includes the information for controlling a switching of a P-Channel MOSFET the gate of which is connected to a drive output of the driver circuit. For generating the drive signal the driver circuit includes a turn-off bipolar transistor which is powered by the supply voltage received at the power input in that its collector is connected to the power input. The control signal received at the control input is amplified by means of a current amplifier and fed to the base of the bipolar transistor via an inverting capacitor. In response to the amplified control signal at its base, the bipolar transistor actively generates a turn-off signal and provides the turn-off signal to the drive output in that the emitter of the bipolar transistor is connected to the drive output. This driver circuit is immune against a voltage build-up between the gate and the source of the P-Channel MOSFET during the turn-off period and the risk of undesired turn-on of the MOSFET during the OFF period is significantly reduced.

11 Claims, 2 Drawing Sheets

(56) References Cited

U.S. PATENT DOCUMENTS

| | | | |
|---|---|---|---|
| 4,500,801 A | | 2/1985 | Janutka |
| 4,694,202 A | * | 9/1987 | Iwamura .......... H03K 19/09448 |
| | | | 326/110 |
| 5,402,386 A | * | 3/1995 | Tavrow .................... G11C 7/18 |
| | | | 326/105 |
| 7,639,094 B1 | * | 12/2009 | Stevenson ................ H03B 5/36 |
| | | | 331/108 C |
| 9,007,098 B1 | * | 4/2015 | Viviani ................ G09G 3/3614 |
| | | | 327/108 |
| 2006/0165142 A1 | * | 7/2006 | Robinson .............. H01S 5/0014 |
| | | | 372/38.07 |
| 2008/0061837 A1 | * | 3/2008 | Xu ................... H03K 19/01852 |
| | | | 326/127 |
| 2009/0323864 A1 | * | 12/2009 | Tired .................... H03D 3/008 |
| | | | 375/319 |
| 2012/0046571 A1 | * | 2/2012 | Varpula ................ A61B 5/0531 |
| | | | 600/547 |
| 2014/0254779 A1 | * | 9/2014 | Zheng .................... H04M 11/00 |
| | | | 379/93.06 |
| 2017/0093393 A1 | * | 3/2017 | Alcalde ................ H03K 17/567 |

\* cited by examiner

DRIVER FOR A P-CHANNEL MOSFET

TECHNICAL FIELD

The invention relates to a driver circuit for driving a P-Channel MOSFET, including a supply input for receiving a DC supply voltage, a control input for receiving a control signal for controlling a switching of the P-Channel MOSFET and a drive output for connecting a gate of the P-Channel MOSFET, wherein the driver circuit is adapted to generate a drive signal in dependency of the control signal received at the control input and further adapted to provide the drive signal at the drive output. The invention further relates to a corresponding method for driving a P-Channel MOSFET.

BACKGROUND ART

Electronically controllable switches, or briefly "switches", such as transistors, variants thereof and circuits including one or more of these devices are widely used in many different applications. Important examples are switched power supplies, where often MOSFETs (metal-oxide-semiconductor field-effect transistor) are used as the power switches. Two main types of MOSFETs exist: P-Channel MOSFETs and N-channel MOSFETS. Both types need different voltage control signals for proper function.

The signal for controlling the switching of such a MOSFET usually is provided by a controller and a driver circuit (also designated briefly as "driver" in the following) is used to translate the control signal received from the controller into a drive signal for properly driving the MOSFET. This is necessary because the characteristics of a control signal provided by a controller, in particular the provided voltage levels, usually do not match the requirements of the particular type of MOSFET used.

In the case of a P-Channel MOSFET, the driver has to apply a negative voltage to the gate-source junction of the MOSFET to switch the MOSFET ON, where the negative voltage has to be below the threshold voltage of the particular MOSFET. In order to turn the MOSFET OFF, a voltage above the threshold voltage has to be applied to the gate-source junction of the MOSFET. If the threshold voltage of a P-Channel MOSFET is for example −3 Volts, applying a voltage of −10 Volts to the gate-source junction of that MOSFET turns it ON. Applying however a voltage of for example −1 Volts to the gate-source junction of that MO SFET turns it OFF.

Two well known and widely used P-Channel MOSFET drivers are the two-stage gate drivers and the AC-coupled gate drivers. As the name already implies, the two-stage gate drivers include two different stages to provide the drive signal wherefore they have a high degree of complexity. Depending on the particular application, they also have other drawbacks such as for example relatively high power losses and/or switching frequency limitations. The AC-coupled gate drivers have been proposed to reduce the complexity of the driver. The supply voltage is fed through an inverting capacitor to the gate during the turn-on and -off and through a resistor during the on-state. The limitations include for example frequency and duty cycle limitations as the coupling capacitor needs to discharge during turn-off via a high impedance path, a high power loss in the DC current resistor and the need for an external gate-source capacitor. Such a driver circuit is shown in the drawings and described further below. Such AC-coupled driver circuits are easy to implement and cost effective.

However, they are not immune against voltage build-up directly between the gate and the source of the P-Channel MOSFET due to charge displacement or capacitive coupling during the turn-off period. The main problem comes from the fact that the inverting capacitor constitutes a high DC impedance between the driver and the gate of the P-Channel MOSFET. This high DC impedance is what enables a DC voltage to build-up in the gate of the P-Channel MOSFET. Such a voltage build-up can lead to undesired turn-on of the MOSFET which in turn may lead to a malfunction or even damage of the higher level circuit that includes the MOSFET.

SUMMARY OF THE INVENTION

It is therefore an object of the invention to create a driver circuit for driving a P-Channel MOSFET pertaining to the technical field initially mentioned, that enhances the immunity against such undesired voltage build-up between the gate and the source of the P-Channel MOSFET. It is a further object of the invention to provide a driver unit including such a driver circuit, a controllable switching unit including such a driver unit and a corresponding method for driving a P-Channel MOSFET.

In the following the simpler term MOSFET is sometimes used instead of the term P-Channel MOSFET.

The solution of the invention is specified by the features of claim 1. A driver circuit for driving a P-Channel MOSFET includes a supply input for receiving a DC supply voltage to provide the necessary energy to the active parts of the driver circuit. The driver circuit further includes a control input for receiving a control signal delivering the information for controlling a switching of the P-Channel MOSFET. Such a control signal usually consists in a series of two different voltage levels where one of these voltage levels means that the MOSFET shall be switched ON and the other voltage level means that the MOSFET shall be switched OFF. And the driver circuit includes a drive output for connecting a gate of the P-Channel MOSFET to be controlled. The driver circuit thereby is adapted to generate a drive signal in dependency of the control signal received at the control input and is further adapted to provide the drive signal at the drive output.

According to the invention the driver circuit includes a turn-off bipolar transistor (also designated as turn-off transistor or simply transistor in the following. The turn-off transistor has a base, a collector and an emitter, wherein the base is connected to the control input of the driver circuit via an inverting capacitor which is necessary to provide the voltage inversion. The inverting capacitor further provides DC-decoupling such that the correct inverted voltage level needed to properly drive the P-Channel MOSFET can be generated. The collector is directly connected to a terminal of the supply input and the emitter is connected to the drive output. For turning OFF the MOSFET, the turn-off transistor actively generates the turn-off signal and provides it to the drive output. In this way, the drive output is merely AC coupled with the input of the driver circuit.

When using the driver circuit according to the prior art a constant voltage that is different from 0 Volts may remain or build up across the gate-source terminals of the P-Channel MOSFET during the OFF-period. This may happen because the DC coupling resistor has a too high resistance, which prevents discharging of the driver. The particular level of this voltage depends on different parameters of the higher level circuit as well as the MOSFET to be driven and also on other factors. If the level of this remaining voltage lies within or near the threshold voltage of the MOSFET, the risk of undesired turn ON of the MOSFET becomes higher.

Now, if using a bipolar transistor arranged in the driver circuit according to the invention, such a constant voltage is eliminated. The turn off bipolar transistor actively clamps any voltage build up between gate and source which could switch the MOSFET on. It acts as a high impedance DC coupling during turn on and low impedance DC coupling at turn off.

In one example according to the invention, the emitter of a npn bipolar transistor is connected to the gate of the MOSFET to be controlled and its collector is connected to the supply voltage, its base is connected to the control input via the inverting capacitor and a diode, preferably a Schottky diode, is arranged between the base and the emitter such that the diode's cathode is connected to the base. If the MOSFET is switched ON, a high negative level voltage shall be present at its gate wherefore a high negative level voltage is provided to the base of the turn-off bipolar transistor. The diode is biased and the voltage in the gate goes negative and the bipolar transistor is reversely biased and stays off. If the MOSFET shall be switched OFF, a low negative level voltage shall be provided to the gate of the MOSFET. In this case, the base of the turn-off transistor is actively brought to a low negative level such as for example the ground level voltage wherefore the base-emitter current rapidly increases the biasing of the transistor. The diode is reverse biased and remains blocked ceases. The emitter voltage and therewith the MOSFETs gate voltage also are actively brought to ground level and the MOSFET is switched OFF.

If the voltage doesn't reach the turn off level, or the emitter voltage is lower than the forward biasing voltage of the bipolar transistor, it will keep conducting the current till the level is achieved. Or in other words, there is no voltage build-up between the gate and the source of the P-Channel MOSFET during the turn-off period, neither due to charge displacement nor due to capacitive coupling or other reasons.

The drive circuit according to the invention is therefore immune against such voltage build-up and the risk of undesired turn-on of the MOSFET during the OFF period and therewith the risk of malfunction or even damage of the higher level circuit is significantly reduced.

When the turn-off transistor is switched ON a current flows from its collector to its emitter. Since only a small part of this collector-emitter current is flowing into the gate of the MOSFET a current path from the emitter back to the supply input has to be provided for this current. To do so, the emitter may for example be connected to ground, advantageously via a resistor.

In a preferred embodiment of the invention, a diode is connected in conducting direction from the emitter to the base of the turn-off transistor. Accordingly, its cathode is connected to the emitter and its anode to the base of the turn-off transistor. This diode also enables discharging the gate-source capacity of the MOSFET and blocks a current flow from the base to the emitter of the transistor.

Generally, every pnp bipolar transistor may be used as the turn-off bipolar transistor. But since the voltage drop at the gate of the MOSFET is the key condition for the MOSFET to block the drain source current, this voltage drop should be executed as fast as possible. Accordingly, in a preferred embodiment of the invention, a fast switching bipolar transistor is used as the turn-off bipolar transistor. The switching speed of a bipolar transistor i. e. its time constant not only depends on the circuit elements in which the transistor is embedded, such as for example the input resistor at the base of the transistor, but also on the characteristics of the transistor itself such as for example its input capacity and its input resistance.

The emitter of the turn-off transistor may be connected directly to the gate of the MOSFET. This will work if only small currents are flowing into or out of the gate of the P-Channel MOSFET. However, if the currents become higher the risk of damage of the MOSFET itself or other circuits connected to it increases. The current flowing into or out of the gate of the MOSFET is advantageously limited by any suitable means such as for example thermistors, constant-current diodes etc.

The most simple and therefore preferred way to limit the current is a resistor. Accordingly, the emitter of the turn-off transistor is connected to the drive output, i. e. to the gate of the MOSFET, via a current limiting resistor. This resistor limits the current flowing into or out of the gate of the P-Channel MOSFET thereby protecting the circuit efficiently. This current limiting resistor may also influence other parameters of the circuit such as for example the switching speed of the MOSFET itself and therewith the EMC characteristics of the circuit.

Instead of or in addition to the current limiting resistor, other elements like for example resistors, capacities and/or inductivities may be connected between the gate of the MOSFET and the emitter of the transistor. For example, a capacity may be connected in series or in parallel with the current limiting resistor.

Depending on the characteristics of the control signal received from the controller, in particular its voltage level, this control signal may directly be used to be connected to the base of the turn-off transistor to generate the control signal provided at the drive output.

However, the characteristics of the control signal received from the controller usually do not match the requirements regarding the signal that has to be provided at the drive output to drive the MOSFET. For example the voltage level of the control signal from the controller may either be too low or too high. Or the current level provided is higher or lower than required.

The controller often delivers a control signal having a voltage and/or current level of a logic circuit which is usually too low to directly use it as a drive signal. In a preferred embodiment of the invention an amplifier, in particular a current amplifier is therefore connected to the control input of the drive circuit for amplifying the control signal received from the controller and provide the amplified control signal to the base of the turn-off transistor that is connected to the output of the current amplifier via the inverting capacitor.

Different types of current amplifiers are known to the skilled person and may be used to amplify the control signal. In a preferred embodiment of the invention, the amplifier includes a npn bipolar transistor connected with its collector to a supply terminal (high level) of the supply input and a pnp bipolar transistor connected with its emitter to an emitter of the npn bipolar transistor and with its collector to the ground terminal (low level) of the supply input. The base terminal of both bipolar transistors is connected to the control input via a resistor and the output of the current amplifier is provided at the common emitter terminal of the bipolar transistors.

In this way the control signal applied to the control input is reproduced at the amplifier output and may be used to generate the control signal to be provided to the gate of the MOSFET. The reproduced control signal accordingly has specified characteristics which may be adjusted or set by the circuit parameters such as the size of the resistor connected between the control input and the amplifier, the level of the supply voltage and/or by a particular choice of the bipolar transistors forming the amplifier.

In the prior art AC-coupled drive circuits, the DC-coupling is provided directly at the gate of the P-Channel MOSFET. However, in a preferred embodiment of the invention, the DC-coupling is done at the base of the bipolar transistor. Preferably by connecting a DC-coupling resistor between the base of the turn-off bipolar transistor and the lower terminal of the supply input where the lower terminal usually is connected to ground.

Due to the DC gain of the bipolar transistor, the DC-coupling resistor may have a higher resistance which reduces the losses of the driver circuit.

In another preferred embodiment of the invention, a serial circuit of a resistor and a diode is connected in parallel to the DC-coupling resistor. The cathode of the diode is connected to the negative terminal of the supply input and the resistor is connected between the base of the bipolar transistor and the anode of the diode. Thereby, the resistance of the resistor of this serial circuit is at least ten times smaller than the resistance of the DC-coupling resistor. Preferably, this serial circuit resistor should be made as small as possible such as for example at least a hundred or even a thousand times smaller than the DC-coupling resistor. In this way, the DC-coupling resistor prevents or at least strongly reduces a current flow between the inverting capacitor and ground in both directions whereas the serial circuit enables a current flow from the inverting capacitor to ground such as for example to discharge the inverting capacitor or the gate-source capacitor of the MOSFET but prevents a current flow in the other direction.

The solution of the invention regarding the driver unit is specified by the features of claim 10. The driver unit according to the invention includes a driver circuit as described above and a supply circuit for providing the DC supply voltage to the supply input of the driver circuit. The supply circuit comprises two supply terminals for connecting a voltage source. A resistor is connected in series to one of the supply terminals and a capacitor is connected between the resistor and the other supply terminal, where the DC supply voltage is provided across the capacitor. Usually, the resistor is connected to the positive supply terminal of the voltage source. However, it may also be connected to the negative supply terminal of the voltage source which preferably has ground level.

The solution of the invention regarding the controllable switching unit is specified by the features of claim 11. The controllable switching unit according to the invention includes a driver unit as described above and a P-Channel MOSFET wherein the drive output of the driver circuit is connected to a gate of the P-Channel MOSFET. Preferably, the source of the P-Channel MOSFET is connected to ground.

The solution of the invention regarding the method for driving the P-Channel MOSFET is specified by the features of claim 12. The method includes the following steps:

The control signal for controlling the switching of the P-Channel MOSFET is received and the drive signal for driving the MOSFET is generated in dependency of the control signal where the drive signal is provided to the gate of the P-Channel MOSFET. According to the invention, the turn off signal, i. e. the drive signal for turning off the P-Channel MOSFET is actively generated by means of a turn-off bipolar transistor where the turn off signal is provided to the gate of the P-Channel MOSFET.

Other advantageous embodiments and combinations of features come out from the detailed description below and the totality of the claims.

BRIEF DESCRIPTION OF THE DRAWINGS

The drawings used to explain the embodiments show.

In the figures, the same components are given the same reference symbols.

PREFERRED EMBODIMENTS

Figure 1:
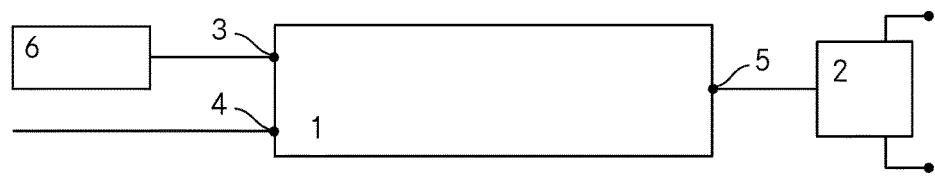
FIG. 1 is a schematic depiction of a P-Channel MOSFET and a driver circuit for driving the P-Channel MOSFET according to the prior art as well as supply circuit for supplying the driver circuit with power.

FIG. 1 shows a schematic depiction of a prior art driver circuit 1 for driving a P-Channel MOSFET 2. The driver circuit 1 includes a power input 3, a control input 4 and a drive output 5. A power supply 6 provides power to the power input 3 and the control signal to control the switching of the P-Channel MOSFET 2 is received at the control input 4.

Based on the control signal received at the control input 4, the drive circuit 1 produces the drive signal for driving the P-Channel MOSFET 2. The drive signal is provided at the drive output 5 which is connected to the control terminal of the P-Channel MOSFET 2.

Figure 2:
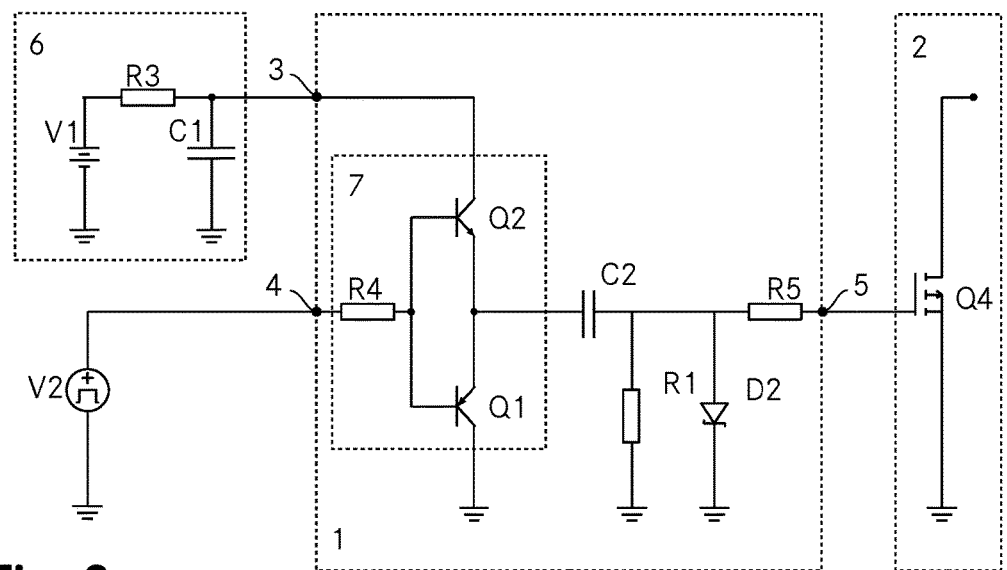
FIG. 2 shows a more detailed schematic depiction of the circuit shown in FIG. 1.

FIG. 2 shows a more detailed schematic depiction of the driver circuit 1, the P-Channel MOSFET 2 and the power supply 6 shown in FIG. 1. The power supply 6 includes a power source, usually a DC power source V1. A resistor R3 is connected in series to the power source V1 and a capacitor C1 is connected across the serial circuit of the power source V1 and the resistor R3. The supply voltage is provided across the capacitor C1 and is fed to the power input 3 of the driver circuit 1. The control signal is shown as a voltage source V2 connected to the control input 4. The voltage source V2 is shown to provide a signal being a series of alternating low and high levels representing the control signal. The drive output 5 of the drive circuit 1 is connected to the gate of the P-Channel MOSFET Q4.

The driver circuit 1 is an AC-coupled gate driver as known in the art. The control input is fed to a current amplifier 7. The current amplifier 7 includes a resistor R4 at its input and two bipolar transistors Q1, Q2 connected in series. The bipolar transistor Q2 is a npn bipolar transistor the collector of which is connected to the power input 3. The emitter of the bipolar transistor Q2 is connected to the emitter of the other bipolar transistor Q1 which is a pnp bipolar transistor. The collector of the bipolar transistor Q1 is connected to ground. The control input is connected to the base of both bipolar transistors Q1, Q2 via resistor R4 and the common emitter terminals of both bipolar transistors Q1, Q2 form the amplifier output.

The amplifier output is connected to the gate of the P-Channel MOSFET via a coupling or inverting capacitor C2 and further via a current limiting resistor R5.

A further resistor R1, in particular a DC coupling resistor and a diode D2, in particular a Schottky diode, are connected in parallel between the common terminal of the inverting capacitor C2 and the current limiting resistor R5 and ground such that the cathode of the diode D2 is connected to ground.

Accordingly, the supply voltage is fed from the inverting capacitor C2 and the resistor R5 to the gate during turn-off. During turn-off the capacitor C2 discharges via the current limiting resistor R5, leading to high power losses and to some limitations regarding frequency and duty cycle of this kind of driver circuit.

Further, during the turn-off a voltage may be built-up between the gate and the source of the P-Channel MOSFET due to charge displacement or capacitive coupling. Such a voltage build-up can lead to undesired turn-on of the MOSFET which in turn may lead to a malfunction or even damage of the higher level circuit that includes the MOSFET.

Figure 3:
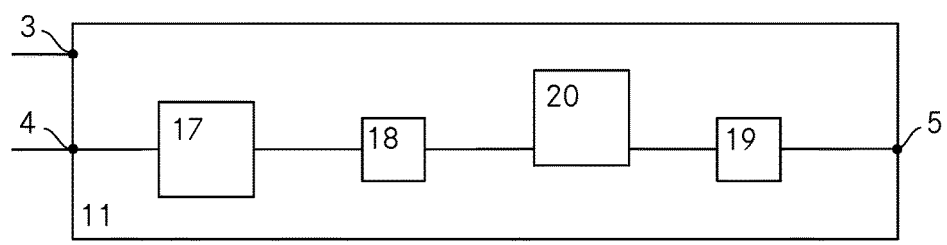
FIG. 3 is a schematic depiction of a driver circuit for driving a P-Channel MOSFET according to the invention.

FIG. 3 shows a schematic depiction of a driver circuit 11 according to the invention. The structure of this driver circuit 11 is similar to the driver circuit shown in FIGS. 1 and 2. The driver circuit 11 is powered by a power supply connectable to the power input 3 and a control signal is fed to the control input 4. The control signal is amplified by a current amplifier 17, the output of which is fed to a coupling capacitor 18. The drive signal produced by the drive circuit 11 is fed via a current limiting resistor 19 to the drive output 5 which then is connected to the gate of a P-Channel MOSFET.

Contrary to the driver circuit shown in FIGS. 1 and 2, the driver circuit 11 further includes a bipolar transistor 20. Accordingly, the amplified control signal is not used to directly generate the drive signal but it is fed to the base of the bipolar transistor 20 which then provides the drive signal to be fed to the drive output 5 via the current limiting resistor 19.

Figure 4:
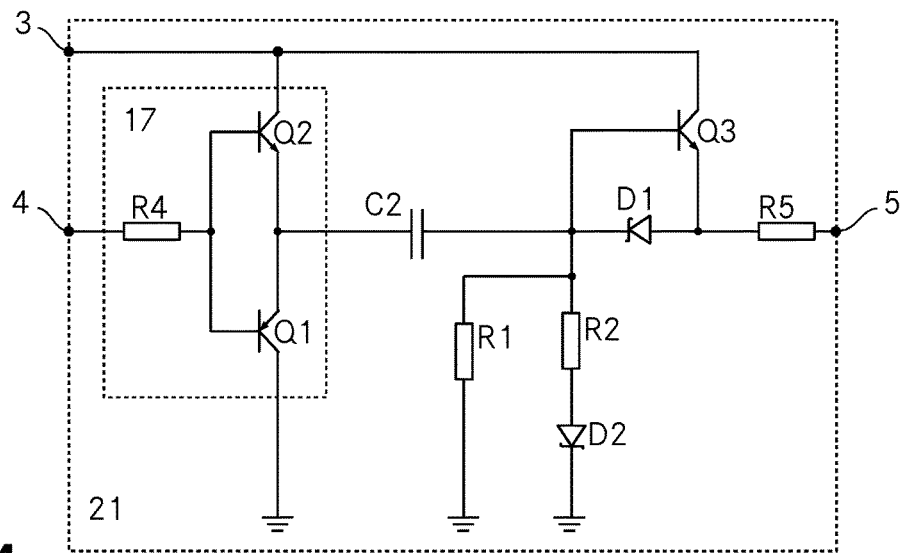
FIG. 4 shows a more detailed, first embodiment of a driver circuit for driving a P-Channel MOSFET according to the invention

FIG. 4 shows a more detailed depiction of a first embodiment of a driver circuit according to the invention. The current amplifier 17 is identical to the one shown in FIG. 2. It includes two bipolar transistors Q1, Q2 connected in series where the control input is connected to the base of both transistors Q1, Q2 and where the common emitter terminals form the amplifier output. The amplifier output is fed to the base of a npn bipolar transistor Q3 via the coupling capacitor C2 where the collector of the npn bipolar transistor Q3 is connected to the positive voltage rail of the power input 3 which supplies the driver circuit 21 and the emitter of the npn bipolar transistor Q3 is connected the drive output 5 via the current limiting resistor R5.

Further, a diode D1, preferably a Schottky diode, connects in current conducting direction the emitter of the npn bipolar transistor Q3 to the base of the npn bipolar transistor Q3.

And in order to slightly limit the current flowing from the capacitor C2 to ground, a resistor R2 is connected in series to the anode of the diode D2. The resistance of the resistor R2 is much smaller than the resistance of the resistor R1.

In the following exemplary values for the elements shown in FIG. 4 as well as exemplary types of elements that may be used for an implementation of this first embodiment are given:

R1 10 kOhm
R2 1 Ohm
R3 10 Ohm
R4 22.1 Ohm
R5 3.32 Ohm
C1 470 nFarad
C2 220 nFarad
D1, D2 Schottky diodes SL04
Q1, Q3 npn bipolar transistor FMMT618
Q2 pnp bipolar transistor FMMT718
V1 12 Volts DC In this embodiment, the turn-off transition is done through the fast-switching bipolar transistor Q3. The DC-coupling resistor R1 is placed between the base the npn bipolar transistor Q3 and ground, which also means that the DC-coupling resistor R1 is placed between the base the npn bipolar transistor Q3 and the source of the P-Channel MOSFET Q4. Accordingly, it can be made higher which reduces the power losses.

This circuit results in a shorter turn-off transition which further reduces the losses and also avoids undesired burst-mode effects that may be caused by slow driver circuits. Further, the DC-coupling by means of the resistor R1 after the coupling capacitor C2 is not done in the gate of the P-Channel MOSFET Q4 but in the base of the npn bipolar transistor Q3. The DC gain of the npn bipolar transistor Q3 thereby allows the establishment of the same DC-coupling with a higher resistance of the DC-coupling resistor R1 which, as already mentioned, reduces the losses.

Furthermore, when applying the same values as mentioned above in connection with the first embodiment to the driver circuit 1 according to the prior art, it has been found that a constant negative voltage of about −1 V remains across the gate-source terminals of the P-Channel MOSFET during the OFF period. This constant negative voltage does not lie within the range of the threshold window of the gate-source voltage of the P-Channel MOSFET that is required to turn the MOSFET ON, but is a value near it. For the P-Channel MOSFET used, the threshold window is between −2 Volts and −4 Volts. Depending on the circuit parameters and the used P-Channel MOSFET, this voltage can also be higher or lower. For an alternative P-Channel MOSFET and with a supply voltage of 12 Volts a constant negative voltage of about −3.6 Volts has been measured during the OFF period. Again, this voltage is in the range of the threshold window of the P-Channel MOSFET.

Simulation and measurements have shown that, with the values mentioned above, in the driver circuit 21 according to the invention the constant negative voltage across the gate-source terminals of the P-Channel MOSFET during the OFF period is eliminated. This ensures, independently of the power supply and circuit parameters, that the P-Channel MOSFET is operating properly at all times.

Figure 5:
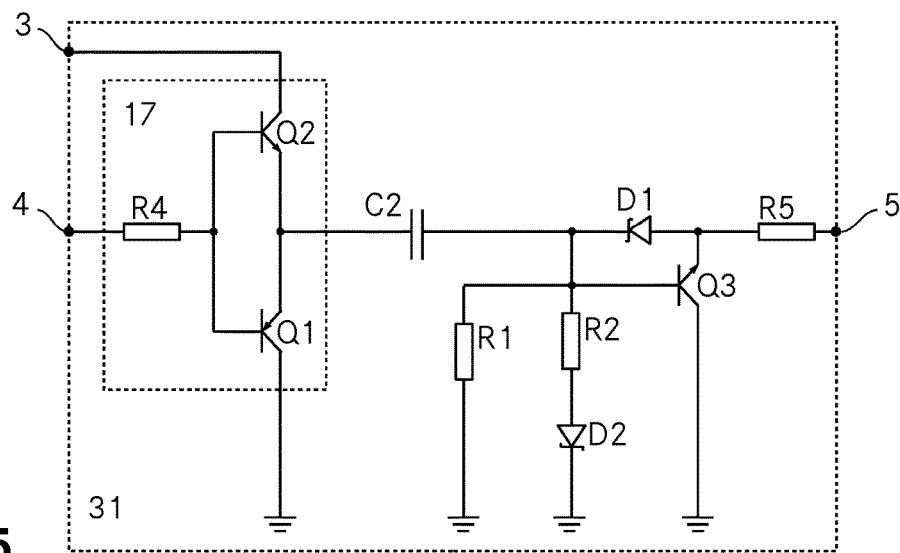
FIG. 5 shows a more detailed, second embodiment of a driver circuit for driving a P-Channel MOSFET according to the invention.

FIG. 5 shows a second embodiment of a driver circuit 31 according to the invention. This second embodiment is almost identical to the first embodiment shown in FIG. 4. The only difference is how the additional bipolar transistor Q3 is connected to the supply voltage. In this embodiment, the collector of the npn bipolar transistor Q3 is connected to the source of the P-Channel MOSFET to be driven which in this example means that the collector of the npn bipolar transistor Q3 is connected to ground.

The above mentioned values may also be used for an implementation of this second embodiment and the characteristics and advantages mentioned in connection with the first embodiment also apply to this second embodiment.

Further resistors may be provided to further reduce the losses or to limit the charge and or discharge currents of the coupling or inverting capacitor and/or the gate-source capacitance of the P-Channel MOSFET. For example, an additional resistor may be arranged across the gate-source terminals of the P-Channel MOSFET.

In summary, it is to be noted that the driver circuit according to the invention allows to effectively drive a P-Channel MOSFET thereby not only reducing the power losses but also enhancing the performance of the driver.

The driver circuit according to the invention particularly finds application to drive P-Channel MOSFETs in power supply topologies where the P-Channel MOSFETs work complementarily to an N-Channel MOSFET. It may however be applied to any other circuit where a P-Channel MOSFET has to be driven.

The invention claimed is:

1. Driver circuit for driving a P-Channel MOSFET, including a supply input for receiving a DC supply voltage, a control input for receiving a control signal for controlling a switching of the P-Channel MOSFET and a drive output for connecting a gate of the P-Channel MOSFET, wherein the driver circuit is adapted to generate a drive signal in dependency of the control signal received at the control input and further adapted to provide the drive signal at the drive output, wherein the driver circuit includes a turn-off bipolar transistor for actively generating a turn-off signal and providing the turn-off signal to the drive output, the turn-off bipolar transistor having a base, a collector and an emitter, wherein the base is connected to the control input via an inverting capacitor, the collector is connected directly to a terminal of the supply input and the emitter is connected to the drive output.

2. Driver circuit according to claim 1, wherein a diode is connected in conducting direction from the emitter to the base of the turn-off bipolar transistor.

3. Driver circuit according to claim 1, wherein the turn-off bipolar transistor is a fast switching bipolar transistor.

4. Driver circuit according to claim 1, wherein the emitter of the turn-off bipolar transistor is connected to the drive output via a current limiting resistor.

5. Driver circuit according to claim 1, wherein a current amplifier is connected to the control input for amplifying the control signal and wherein the base of the turn-off bipolar transistor is connected to an output of the current amplifier via the inverting capacitor.

6. Driver circuit according to claim 5, wherein the amplifier includes a npn bipolar transistor connected with its collector to a supply terminal of the supply input and a pnp bipolar transistor connected with its emitter to an emitter of the npn bipolar transistor and with its collector to a ground terminal of the supply input, wherein the base terminal of both bipolar transistors is connected to the control input via a resistor and wherein the output of the current amplifier is provided at the common emitter terminals of the bipolar transistors.

7. Driver circuit according to claim 1, wherein a DC-coupling resistor is connected between the base of the turn-off bipolar transistor and a negative terminal of the supply input.

8. Driver circuit according to claim 7, wherein a serial circuit of a resistor and a diode is connected in parallel to the DC-coupling resistor where a cathode of the diode is connected to the negative terminal of the supply input and where the resistor is connected between the base of the bipolar transistor and the anode of the diode and where a resistance of the serial circuit resistor is at least ten times, preferably at least a hundred times and even more preferably at least a thousand times smaller than a resistance of the DC-coupling resistor.

9. Driver unit including a driver circuit according to claim 1, further including a supply circuit for providing the DC supply voltage to the supply input of the driver circuit, the supply circuit comprising two supply terminals for connecting a voltage source, a resistor connected in series to one of the supply terminals and a capacitor connected between said resistor and another one of the supply terminals, wherein the DC supply voltage is provided across the capacitor.

10. Controllable switching unit, including a driver unit according to claim 9 and a P-Channel MOSFET wherein the drive output of the driver circuit is connected to a gate of the P-Channel MOSFET.

11. Method for driving a P-Channel MOSFET, wherein a control signal for controlling a switching of the P-Channel MOSFET is received, a drive signal is generated in dependency of the control signal by feeding the control signal through an inverting capacitor, wherein the drive signal is provided to a gate of the P-Channel MOSFET, characterised in that a turn off signal is actively generated by means of a turn-off bipolar transistor and in that the turn off signal is provided to the gate of the P-Channel MOSFET.

* * * * *